United States Patent
Arumugam et al.

(10) Patent No.: US 12,241,923 B2
(45) Date of Patent: Mar. 4, 2025

(54) ELECTRICALLY SMALL SELF-RESONANT ELECTRO-QUASISTATIC EXCITER AND DETECTOR WITH CANCELED MAGNETIC FIELD

(71) Applicant: CALIFORNIA INSTITUTE OF TECHNOLOGY, Pasadena, CA (US)

(72) Inventors: Darmindra D. Arumugam, Pasadena, CA (US); Jack D. Bush, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 213 days.

(21) Appl. No.: 17/511,464

(22) Filed: Oct. 26, 2021

(65) Prior Publication Data
US 2022/0052457 A1   Feb. 17, 2022

Related U.S. Application Data

(63) Continuation of application No. PCT/US2020/031939, filed on May 7, 2020.

(60) Provisional application No. 62/914,017, filed on Oct. 11, 2019, provisional application No. 62/846,451, filed on May 10, 2019.

(51) Int. Cl.
   *G01R 29/12*   (2006.01)

(52) U.S. Cl.
   CPC .................. *G01R 29/12* (2013.01)

(58) Field of Classification Search
   CPC .......... G01R 29/12; H01Q 9/16; H01Q 11/12; H01Q 11/14; H01Q 11/08
   See application file for complete search history.

(56) References Cited

U.S. PATENT DOCUMENTS

| 6,239,760 B1 * | 5/2001 | Van Voorhies | H01Q 11/08 343/866 |
| 6,320,550 B1 * | 11/2001 | Van Voorhies | H01Q 11/14 343/866 |
| 2003/0011527 A1 * | 1/2003 | Kokorin | H01Q 11/08 343/866 |

(Continued)

FOREIGN PATENT DOCUMENTS

| EP | 2051397 A2 | 4/2009 |
| GB | 2418781 A | 4/2006 |
| WO | 2020/231755 A1 | 11/2020 |

OTHER PUBLICATIONS

G. Welch and E. Foxlin, "Motion tracking: no silver bullet, but a respectable arsenal," IEEE Computer Graphics and Applications, vol. 22, No. 6, pp. 24-38, Nov. 2002.

(Continued)

*Primary Examiner* — Akm Zakaria
(74) *Attorney, Agent, or Firm* — Steinfl + Bruno LLP

(57) ABSTRACT

An electrically small electroquasistatic antenna having a structure that reduces radiated magnetic fields and maintains suitable radiated electrical fields. The electroquasistatic antenna is a dipole antenna that is electrically short, which presents as a capacitor for use as an electroquasistatic antenna, with one or multiple counterposed inductive elements to resonate the antenna and provide high efficiency while simultaneously canceling the external magnetic fields. The electroquasistatic antenna may be configured for operation as an electroquasistatic exciter or electroquasistatic detector.

9 Claims, 6 Drawing Sheets

(56) References Cited

U.S. PATENT DOCUMENTS

2019/0140701 A1* 5/2019 Greason ........... G06K 19/07779
2020/0099135 A1* 3/2020 Wu ..................... H01Q 9/0464

OTHER PUBLICATIONS

A. S. T. Teixeira, G. Dublon, "A survey of human-sensing: Methods for detecting presence, count, location, track, and identity," ENALab, Yale University, Tech. Rep. Sep. 2010, Sep. 2010.

A. Koutsou, F. Seco, A. Jimenez, J. Roa, J. Ealo, C. Prieto, and J. Guevara, "Preliminary localization results with an rfid based indoor guiding system," in Intelligent Signal Processing, 2007. WISP 2007. IEEE International Symposium on, 2007, pp. 1-6.

B. Denis, J. Keignart, and N. Daniele, "Impact of nlos propagation upon ranging precision in uwb systems," in Ultra Wideband Systems and Technologies, 2003 IEEE Conference on, 2003, pp. 379-383.

D. Arumugam, J. Griffin, and D. Stancil, "Experimental demonstration of complex image theory and application to position measurement," Antennas and Wireless Propagation Letters, IEEE, vol. 10, pp. 282-285, 2011.

H. A. Bethe, "Theory of diffraction by small holes," Phys. Rev., vol. 66, pp. 163-182, Oct. 1944. [Online]. Available: https://link.aps.org/doi/10.1103/PhysRev.66.163.

Q. Balzano, O. Garay, and K. Siwiak, "The near field of omnidirectional helical antennas," IEEE Transactions on Vehicular Technology, vol. 31, No. 4, pp. 173-185, Nov. 1982.

Y. Liao, K. Cai, T. H. Hubing, and X. Wang, "Equivalent circuit of normal mode helical antennas using frequency-independent lumped elements," IEEE Transactions on Antennas and Propagation, vol. 62, No. 11, pp. 5885-5888, Nov. 2014.

A. Galehdar, D. V. Thiel, and S. G. O'Keefe, "Antenna efficiency calculations for electrically small, RFID antennas," IEEE Antennas Wireless Propagation. Letters., vol. 6, pp. 156-159, 2007.

A. Kurs, A. Karalis, R. Moffatt, J. D. Joannopoulos, P. Fisher, and M. Soljai, "Wireless power transfer via strongly coupled magnetic resonances," Science, vol. 317, No. 5834, pp. 83-86, Jun. 7, 2007.

Bush et al., "Counter-Wound Normal Mode Helical Antenna as an Electrically Small Electro-Quasi-Static Exciter," IEEE Antennas And Wireless Propagation Letters, vol. 19, No. 2, Feb. 2020, pp. 287-291, 5 pages.

C. Bouwkamp, "Theoretical and numerical treatment of diffraction through a circular aperture," IEEE Transactions on Antennas and Propagation, vol. 18, No. 2, pp. 152-176, Mar. 1970.

C. E. Calosso, Y. Gruson, and E. Rubiola, "Phase noise and amplitude noise in DDS," in 2012 IEEE International Frequency Control Symposium Proceedings, May 2012, pp. 1-6.

C. J. Bouwkamp, "Diffraction Theory," Reports on Progress in Physics, vol. 17, pp. 35-100, Jan. 1954.

CIA, "Ferrite antennas for very low frequencies," Central Intelligence Agency, Langley, VA, USA, Declassified Rep. CIA-RDP7803424A000500010007-0, Feb. 1957.

D. Arumugam, "Decoupled range and orientation sensing in long-range magnetoquasistatic positioning," Antennas and Wireless Propagation Letters, IEEE, vol. 14, pp. 654-657, 2015.

D. D. Arumugam, "Single-anchor 2-D magnetoquasistatic position sensing for short to long ranges above ground," IEEE Antennas Wireless Propag. Lett., vol. 15, pp. 1325-1328, 2016.

D. D. Arumugam, "Through-the-wall magnetoquasistatic ranging," IEEE Antennas and Wireless Propagation Letters, vol. 16, No. 99, pp. 1439-1442, 2017.

D. Shin, G. Lee, and W. S. Park, "Simplified vector potential and circuit equivalent model for a normal-mode helical antenna," IEEE Antennas Wireless Propag. Lett., vol. 12, pp. 1037-1040, 2013.

General Systems Subcommittee, "Measurement of electric and magnetic fields from alternating current power lines," IEEE Trans. Power App. Syst., vol. PAS-97, No. 4, pp. 1104-1114, Jul. 1978.

H. Hu and S. V. Georgakopoulos, "Wireless power transfer through strongly coupled electric resonance," in Proc. IEEE Antennas Propag. Soc. Int. Symp., Jul. 2013, pp. 836-837.

H. Liu, S. Gao, and T. Loh, "Electrically small and low cost smart antenna for wireless communication," IEEE Trans. Antennas Propag., vol. 60, No. 3, pp. 1540-1549, Mar. 2012.

International Preliminary Report on Patentability issued for International PCT Appln No. PCT/US2020/031939 filed on May 7, 2020 on behalf of California Institute of Technology. Mail Date: Nov. 25, 2021. 8 Pages.

International Search Report and Written Opinion for International application No. PCT/US2020/031939 filed May 7, 2020 on behalf of California Institute of Technology, Mail Date: Aug. 4, 2020, 14 pages.

J. D. Kraus, "The helical antenna," Proc. IRE, vol. 37, No. 3, pp. 263-272, Mar. 1949.

M. N. Roy, "Constructing normal-mode helical antennas," IEE-IERE Proc.—India, vol. 7, No. 3, pp. 119-123, Jul. 1969.

Q. Yu and T. W. Holmes, "A study on stray capacitance modeling of inductors by using the finite element method," IEEE Trans. Electromagn. Compat., vol. 43, No. 1, pp. 88-93, Feb. 2001.

R. W. P. King, "Electromagnetic field of a vertical dipole over an imperfectly conducting half-space," Radio Sci., vol. 25, No. 2, pp. 149-160, 1990.

T. B. A. Senior, "Low-frequency scattering by a dielectric body," Radio Science, vol. 11, No. 5, pp. 477-482, 1976. [Online]. Available: https://agupubs.onlinelibrary.wiley.com/doi/abs/10.1029/RS011i005p00477.

European Extended Search Report for EP Application No. 20729396.0 filed on May 7, 2020 on behalf of California Institute of Technology. Mail Date: Apr. 23, 2024. 7 Pages.

* cited by examiner

|  | Antenna 1 | | Antenna 2 | | Antenna 3 | |
|---|---|---|---|---|---|---|
|  | Loaded | Unloaded | Loaded | Unloaded | Loaded | Unloaded |
| $C_0$ [pF] | 16.09 | 15.82 | 12.03 | 11.64 | 13.39 | 12.52 |
| $C_1$ [pF] | 83.76 | 64.00 | 46.78 | 34.25 | 53.30 | 39.38 |
| $L_1$ [mH] | 1.66 | 0.22 | 2.62 | 0.37 | 2.52 | 0.34 |
| $R_1$ [Ω] | 75.74 | 15.92 | 150.99 | 24.12 | 388.19 | 21.49 |

ELECTRICALLY SMALL SELF-RESONANT ELECTRO-QUASISTATIC EXCITER AND DETECTOR WITH CANCELED MAGNETIC FIELD

CROSS-REFERENCE TO RELATED APPLICATIONS

The present application is a continuation of International Application PCT/US2020/031939 filed on May 7, 2020, which, in turn, claims priority to U.S. Provisional Application 62/846,451 filed on May 10, 2019, and U.S. Provisional Application 62/914,017 filed on Oct. 11, 2019, all of which are incorporated herein by reference in their entirety.

STATEMENT OF GOVERNMENT INTEREST

This invention was made with government support under Grant No. 80NMO0018D0004 awarded by NASA (JPL). The government has certain rights in the invention.

BACKGROUND

1. Field

The present disclosure relates to electroquasistatic excitation and detection. More particularly, the present disclosure relates to structures and methods for electroquasistatic field excitation or detection attained by electrically small apparatus providing magnetic field cancellation.

2. Description of Related Art

Electrically small antennas (ESA's) address the need to have smaller antennas for mobile devices or systems for the purpose of generating or detecting electro-magnetic (EM) fields or waves. An antenna is considered to be an ESA when the antenna has a size that is smaller than its operational wavelength or resonant wavelength. ESA's may be used in wireless communication and sensor applications where EM fields need to be detected or generated in a small form-factor antenna relative to EM wavelength.

Applications relying on static field behaviour instead of EM wave propagation, such as non-line-of-sight navigation and wireless power transfer, have looked to exploit long-wavelength electric and magnetic quasi-static (QS) fields. Magnetoquasistatics is the domain of quasistatic magnetic coupling sensors, devices, or systems and has been shown to be very effective at navigation sensors for non-line-of-sight applications. Quasistatitc magnetic coupling sensors are also used in biomedical applications such as magnetic resonance imaging. ESA magneto-quasi-static (MQS) field generation may be easily obtained through the use of shorted resonant coils, which give low resistances, support strong currents, and extends sensing or communication distances or ranges from the coil.

Given their ability to support operational wavelengths greater than their size, ESAs may be suitable for electro-quasi-static field generation/detection for mobile devices in similar applications. Generation of electro-quasi-static (EQS) fields with an ESA that can have long sensing or communication distances is much more difficult due to the electrically-short linear configurations of wire required for EQS field generations and the size of antenna elements that are typically required in EQS field generation or detection. Another key challenge in ESA electro-quasistatic (EQS) field generation over long-distances within QS is the weak field magnitudes and distorted fields due to heavy dependence on antenna feeding structure. This is due to the short antenna length relative to complex and long feeding structures.

These issues limit the use of EQS fields excited by ESAs for applications such as EQS position sensing over long distances or ranges, where strong EQS fields need to be generated or efficiently detected, and distortions or pertubations to the spatial field distribution minimized. The limited use of an EQS ESA is primarily due to short electrical and physical length of the antenna, $d \ll r < \lambda$, where d is the length, $\lambda$ the wavelength, and r the observation distance.

There is a need in the art for electro-quasistatic (EQS) exciters and detectors that can provide adequate efficiency at a wavelength of operation that is significantly greater than the physical size of the exciter and are not significantly impacted by the feeding structure.

SUMMARY

Described herein are according to embodiments of the present invention that a structure and method for electro-quasistatic excitation or detection. An embodiment comprises an electrically small electroquasistatic antenna having a structure that reduces radiated magnetic fields and maintains suitable radiated electrical fields. An embodiment is a structure that is a center-fed normal mode helical antenna having a first half of the helical coils wound in one direction and a second half of the helical coils would in an opposite direction. The electroquasistatic antenna may be configured for operation as an electroquasistatic exciter or electroquasistatic detector.

One embodiment is an electroquasistatic antenna comprising an antenna having a plurality of interconnected inductive elements, wherein the interconnected inductive elements are configured to cancel an external magnetic field radiated from the electroquasistatic antenna. The plurality of interconnected inductive elements may comprise: a first helix of conducting material wound in a first direction around a center axis; a second helix of conducting material wound in a second direction around the center axis, where the second direction is opposite the first direction; and a differential center feed, wherein a first side of the differential center feed is electrically coupled to a first end of the first helix and a second side of the differential center feed is electrically coupled to a first end of the second helix, where the first end of the first helix and the first end of the second helix are positioned next to each other.

Another embodiment is a method for electroquasistatic excitation comprising: generating electrical energy from a radio-frequency generator; electrically coupling the electrical energy to a plurality of inductive elements, whereby the plurality of inductive elements generate a radiated magnetic field and a radiated electric field; and configuring the plurality of inductive elements to reduce the radiated magnetic field. Electrically coupling the electrical energy to a plurality of inductive elements may comprise coupling the electrical energy to first plurality of inductive elements, whereby the first plurality of inductive elements generate a first magnetic field and a first electric field; and coupling the electrical energy to a second plurality of inductive elements; whereby the second plurality of inductive elements generate a second magnetic field and a second electric field. Configuring the plurality of inductive elements to reduce the radiated magnetic field may comprise configuring the first plurality of inductive elements and the second plurality of inductive elements to reduce a magnetic field resulting from a combination of the first magnetic field and the second magnetic field. The first plurality of inductive elements may comprise a first helix of conductive material and the second plurality of inductive elements may comprise a second helix of conductive material. Configuring the first plurality of inductive elements and the second plurality of inductive elements may comprise: winding the conductive material of the first helix in a first direction; winding the conductive material of the second helix in a second direction opposite the first direction; and disposing the first helix and second helix around a common center axis; and wherein electrically exciting the first helix and second helix may further comprise: coupling electrical energy having a first phase to a first end of the first helix; and coupling electrical energy having a second phase to a first end of the second helix, wherein the second phase has a phase 180 degrees different than the first phase, and wherein the first end of the first helix and the first end of the second helix are positioned next to each other.

Still another embodiment is a method for electroquasistatic detection comprising electrically coupling electrical energy from a plurality of inductive elements to a radio frequency detector, whereby the plurality of inductive elements are configured to receive an electromagnetic field having a received magnetic field and a received electric field; and configuring the plurality of inductive elements to reduce the received magnetic field. Electrically coupling electrical energy from the plurality of inductive elements to a radio frequency detector may comprise coupling electrical energy from a first plurality of inductive elements, whereby the first plurality of inductive elements receive an electromagnetic wave having a first magnetic moment and a first electric moment; coupling electrical energy from a second plurality of inductive elements; whereby the second plurality of inductive elements receive an electromagnetic wave having a second magnetic moment and a second electric moment. Configuring the plurality of inductive elements to reduce the received magnetic field may comprise configuring the first plurality of inductive elements and the second plurality of inductive elements to reduce a received magnetic moment resulting from a combination of a first magnetic moment and a second magnetic moment. The first plurality of inductive elements may comprise a first helix of conductive material, wherein the conductive material of the first helix is wound in a first direction; and the second plurality of inductive elements may comprise a second helix of conductive material.

DETAILED DESCRIPTION

In an EQS exciter or detector, pure electro-quasistatic fields are desired, and undersired magnetic fields generated can cause a pertubation to the detected electro-quasistatic field by an antenna. Embodiments of the present invention provide methods and apparatus to support generation or detection of electric fields, while minimizing the impact of magnetic fields. These methods and apparatus provide approaches for cancelling or reducing the magnetic fields associated with an EQS exciter or detector structure. According to embodiments of the present invention, elements of the EQS exciter or detector may be configured into an antenna, where elements of the antenna are disposed in a manner to cancel or reduce the magnetic moment. In an antenna, inductive elements provide both radiated electric fields and magnetic fields. In embodiments according to the present invention, the inductive elements are configured to reduce or cancel the external magnetic field, while maintaining suitable strength in the external electric field by presenting as capacitive elements. The inductive elements may be considered as being counterposed to reduce or eliminate the external magnetic field.

A Normal Mode Helical Antennas (NMHA) is a typical antenna used for ESA field and wave generation or detection when self-resonance is needed. Antenna self-resonance is desired to increase the efficiency of the antenna. The NHMA is a helically rotated structure which develops or detects fields spatially that can be mathematically described by a dipole moment parallel to the structure, and located at the center of said structure. The NMHA provides sufficient inductance through dense winding to support resonance at low-frequency and appears as an electrically-long structure due to the long wire used, which supports its use as an ESA. To permit efficient ESA operation that is significantly smaller than a wavelength, d«λ, it is not possible to avoid dense windings such as those used in the NMHA antenna. However, due to use of dense windings, the NMHA generates strong MQS fields which heavily distort the measured voltage at a receiver which detects both EQS and MQS fields from the NMHA. The problem is reciprocal for a detector instead of generator.

As discussed above, an NMHA can be configured as an ESA. The purpose of the NMHA in QS systems is to provide an electrically-long wire antenna to ensure strong sinusoidal current distribution, which results in stronger near-fields that can be detected further away from the source (r»d), while maintaining dipole-like fields through a significant portion of the QS regime which is not significantly perturbed by the antenna feed characteristics. In systems where pure EQS fields are desired, the NMHA is not desirable as the helical wire-coils produce strong magnetic fields. An embodiment of the present invention is a counter-wound NMHA (C-NMHA) with arms driven differentially to cancel the magnetic field in the QS region.

Figure 1:
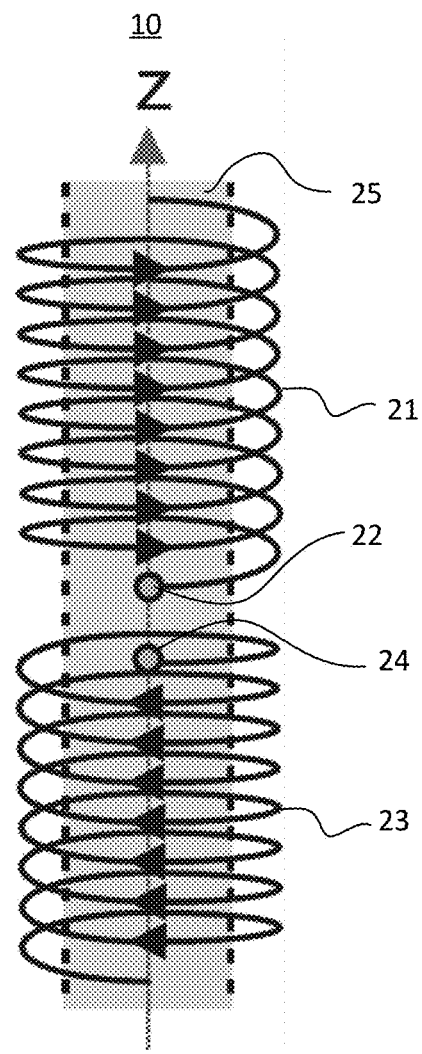
FIG. 1 illustrates a counter-wound Normal Mode Helical Antenna.

The C-NMHA in a QS configuration produces strong EQS dipole fields with a very weak magnetic field component. FIG. 1 illustrates a C-NMHA 10. As shown in FIG. 1, the C-NMHA as a top arm 21 of conductive material, e.g. wire, that is wound in a spiral around a core 25. The C-NMHA also has a bottom arm 23 of conductive material that is wound in around the core in a direction opposite the wind of the top arm 21. So the top arm 21 the and bottom arm 23 are counter-wound. Electrical energy is differentially fed to the top arm 21 at a top arm feed point 22 and to the bottom arm 23 at the bottom arm feed point 24. Since the electrical energy is differentially fed to the two arms 21, 23, currents are driven in the C-NMHA in a positive/negative z direction in each half-wave cycle.

Figure 2:
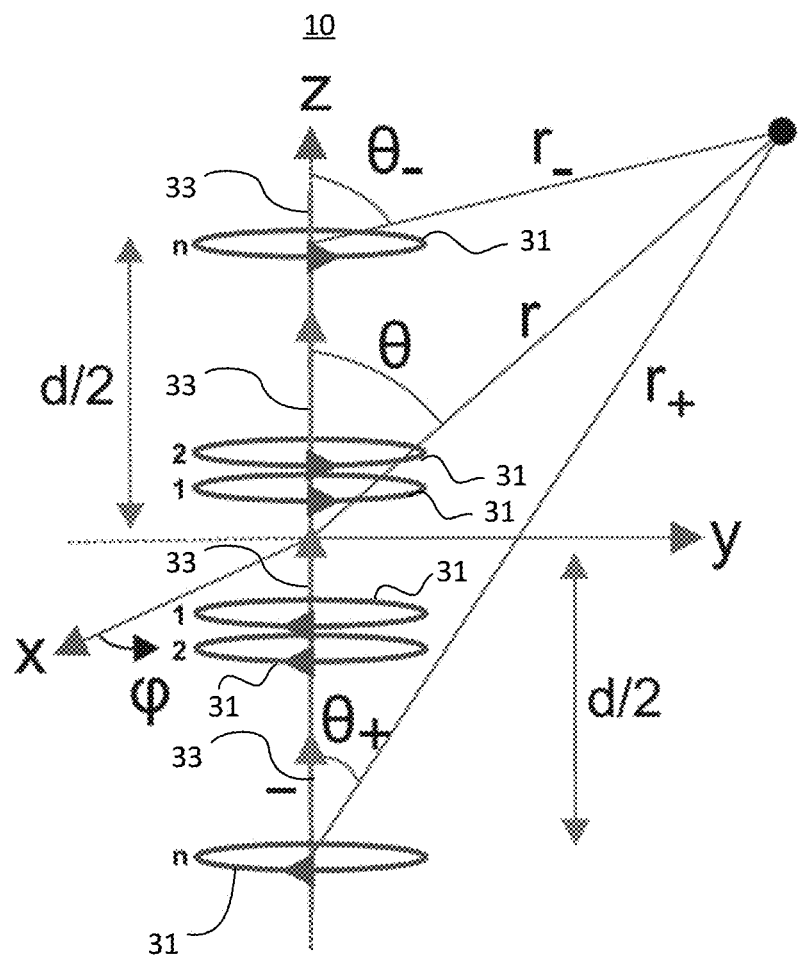
FIG. 2 illustrates a decomposition of a counter-wound Normal Mode Helical Antenna into a superposition of circular current elements and linear current elements.

FIG. 2 illustrates a decomposition of the C-NMHA antenna 10 into a superposition of circular current elements 31 and linear current elements 33. In FIG. 2, the arrows show the direction of current flow. For the C-NMHA, the circular currents on the top and bottom arms are opposing, thus the resulting magnetic field is canceled. The linear current element is not disturbed by the C-NMHA, so the EQS field is dipole-like. Eq. 1 below shows the field strength in vector notations:

$$\vec{E} = \frac{1}{4\pi\varepsilon_0}\left(\frac{3\hat{r}(\vec{p}\cdot\hat{r}) - \vec{p}}{r^3}\right) \quad \text{Eq. 1}$$

where $\vec{r} = r\hat{r}$ is the vector from the origin to observation, $\vec{p} = p\hat{z}$ is the vector electric dipole moment with p the magnitude, and $\varepsilon_0$ is the permittivity of free-space. FIG. 2 shows that inductive elements of the antenna, i.e., the circular current elements 31, being configured to cancel the magnetic field.

The magnetic field of each pair of circular current elements cancel. The lowest-order term is due to dipole-dipole cancellation, and has a radial and circumferential component, for the n-th element, as shown in Eq. 2 below:

$$H_r = \frac{m}{2\pi}\left[\frac{\cos\theta_-}{r_-^3} - \frac{\cos\theta_+}{r_+^3}\right], H_\theta = \frac{m}{4\pi}\left[\frac{\sin\theta_-}{r_-^3} - \frac{\sin\theta_+}{r_+^3}\right] \quad \text{Eq. 2}$$

where m is the magnetic moment.

For large distances, such that r»d, the range elements are approximated shown in Eq. 3 below:

$$r_- \approx r - \frac{d}{2}\cos\theta, r_+ \approx r + \frac{d}{2}\cos\theta \quad \text{Eq. 3}$$

where d is the linear length between the n-th circular elements.

The angular offsets of the elements, defined as $\theta_\Delta = |\theta_{-/+} - \theta|$, under the small angle approximation, is given by Eq. 4 below:

$$\theta_\Delta \approx \tan\theta_\Delta = \frac{(d/2)\sin\theta}{r + (d/2)\cos\theta} \approx \frac{d}{2r}\sin\theta \quad \text{Eq. 4}$$

The angular elements are then given by Eq. 5 below:

$$\theta_- \approx \theta + \frac{d}{2r}\sin\theta, \theta_+ \approx \theta - \frac{d}{2r}\sin\theta \quad \text{Eq. 5}$$

Substituting Eq. 3 and Eq. 5 in Eq. 2, taking the MaClaurin series expansion (Taylor series about d=0), and keeping only the lowest-order term, Eq. 6 below provides the magnetic field intensity:

$$H_r \approx md\left(\frac{1 + 2\cos2\theta}{2\pi r^4}\right), H_\theta \approx md\left(\frac{2\sin2\theta}{4\pi r^4}\right). \quad \text{Eq. 6}$$

The magnetic field is seen to drop-off as $r^{-4}$ instead of the dipole drop-off of $r^{-3}$, i.e., the cancellation results in a higher order field. Circular elements close to each other, as d→0, cancel completely due to scaling of both components with d. The field components have a quadrupolar form. The integrated field of all elements is found by simply replacing d in Eq. 6 with $D = \Sigma d_i$, when $m = m_i$, i.e., all moments have same magnitude, where i denotes each circular element. A traditionally wound NMHA antenna would have a strong magnetic field, similar to the electric distribution shown in Eq. 1.

The electric dipole or linear current element 33 shown in FIG. 2 also excites a weak circular magnetic field that is shown by Eq. 7 below:

$$\vec{H}_p = \frac{j\omega}{4\pi}\left(\frac{\hat{r}\times\vec{p}}{r^2}\right) \rightarrow H_\phi = \frac{j\omega}{4\pi}\frac{p\sin\theta}{r^2} \quad \text{Eq. 7}$$

where subscript p denotes the linear-element or electric-dipole.

The magnitude of the electric dipole moment is found from $p = \int z\rho dz$, where $\rho$ is the linear-charge density found by solving the continuity equation $j\omega\rho = \nabla\cdot\vec{J}$. For the typical sinusoidal current distribution noted below, Eq. 8 below provides the current magnitude:

$$\vec{I} = I_0\sin\left[k\left(\frac{d}{2\sin\alpha} - |z|\right)\right]\hat{z}, \vec{p} = \frac{j4I_0}{\omega k}\sin^2\left(\frac{dk}{4\sin\alpha}\right)\hat{z} \quad \text{Eq. 8}$$

where $I_0$ is the driving current, k the wave-number, and $\alpha$ the helix pitch angle.

To maximize $I_0$ for a given voltage, the antenna is driven at resonance. For low frequency (LF) operation, adding a permeable core lowers the antenna resonant frequency by $(\mu_r/\sqrt{2})^{1/2}$ for an equilength core-to-NMHA, where $\mu_r$ is the relative permeability of the core. With a loss-less core, the electric dipole moment in Eq. 8 is not changed, thus a receiving electric dipole antenna, moment denoted by $\vec{p}_r$, would detect a voltage of $V_e = \vec{E}\cdot\vec{p}_r$ as shown in Eq. 9 below:

$$V_e = \frac{1}{4\pi\varepsilon_0}\left(\frac{3(\vec{p}_r\cdot\hat{r})(\vec{p}\cdot\hat{r}) - \vec{p}_r\cdot\vec{p}}{r^3}\right). \quad \text{Eq. 9}$$

Hence, the C-NMHA can operate as either a radiating antenna, i.e., an exciter, or a receiving antenna, i.e., a detector. As described above, the core 25 of the C-NMHA shown in FIG. 1 may be either an air core or a core comprising magnetic material. As noted above, a magnetic or permeable core provides for a lower operating frequency in the antenna.

Numerical electromagnetic simulations of an embodiment of a C-NMHA according to the present invention were generated to examine the generation of the dipole electric field, as well to determine the cancellation of the magnetic field. Simulations were conducted using the simulation software. The simulated antenna was center fed, had a height of 50 cm, a diameter of 4.2 cm, 1600 turns, and a resonant frequency of 1.71 MHz.

Figure 3:
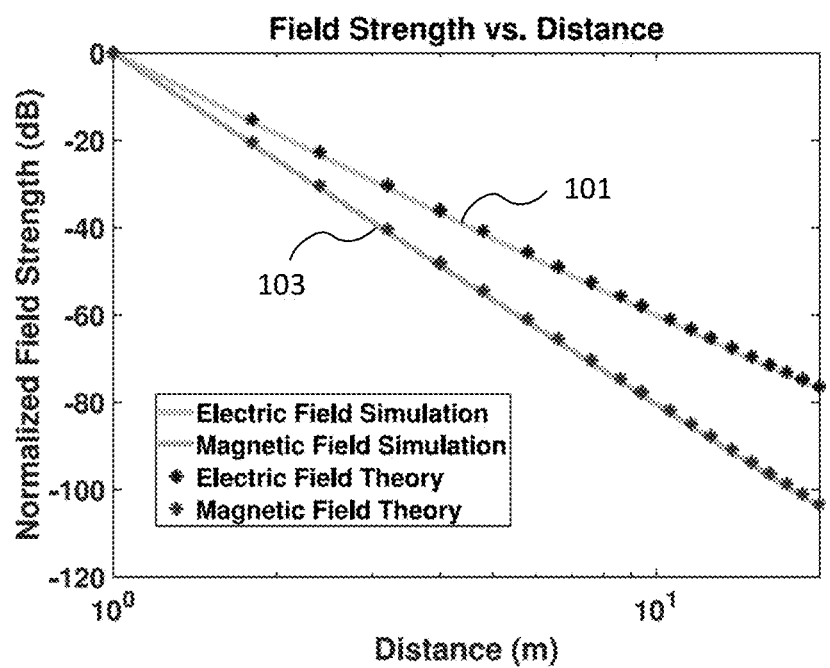
FIG. 3 shows a comparison of magnetic and electric fields generated by a counter-wound Normal Mode Helical Antenna.

The first simulation compared the field decay over distance of both the magnetic and electric fields generated from the C-NMHA. Field values were simulated between 0.6 and 20 meters from the center of the antenna traversing the z-axis. FIG. 3 shows the results of the simulation. The fields are normalized to highlight the difference in field decay over distance. FIG. 3 is plotted on a log-log scale to give a linear response to the exponential drop-off. In FIG. 3, line 101 shows the results obtained from the electric field simulation, while line 103 shows the results obtained from the magnetic field simulation. As shown in FIG. 3, both simulated fields were compared to the theoretical equations, shown by the points plotted on top of lines 101, 103. FIG. 3 shows a good match between the simulated results and the theoretical results. The simulations show an exponential decay of $r^{-3}$ and $r^{-4}$, for the electric and magnetic fields, respectively. The comparison of these two field values confirm the radial drop-off shown in Eqs. 1 and 6.

Figure 4:
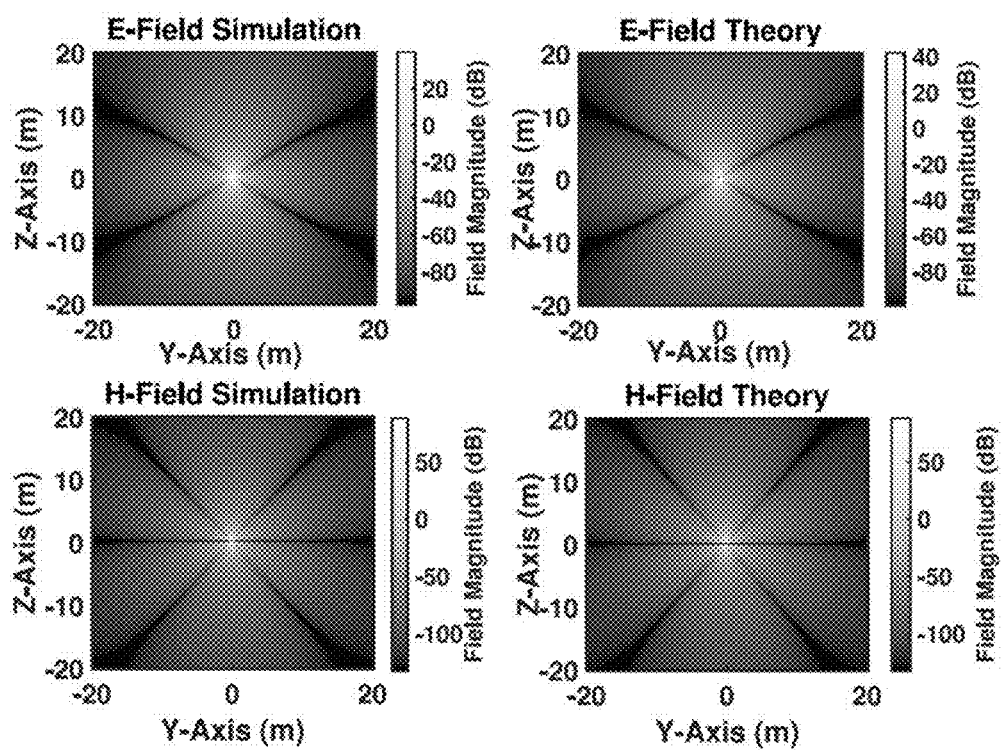
FIG. 4 shows magnitudes of the z-components for theoretical and simulated magnetic and electric fields generated by a counter-wound Normal Mode Helical Antenna on the zy plane.

FIG. 4 shows the magnitudes of the z-components for the simulated electric and magnetic fields compared to the magnitudes from the field equations presented above. The C-NMHA is oriented about the z-axis. Both simulated field components show good agreement with the theoretical equations: The electric field resembles that of the dipole coupling equations in a two dimensional (2D) space, and the magnetic field shows the expected null at z=0 due to the two opposing magnetic moments generated by the structure. The z-components of these fields were plotted to highlight the cancellation of the magnetic field. These simulations confirm the ability of the C-NMHA to generate an electric moment while degrading the magnetic moment.

Figure 5:
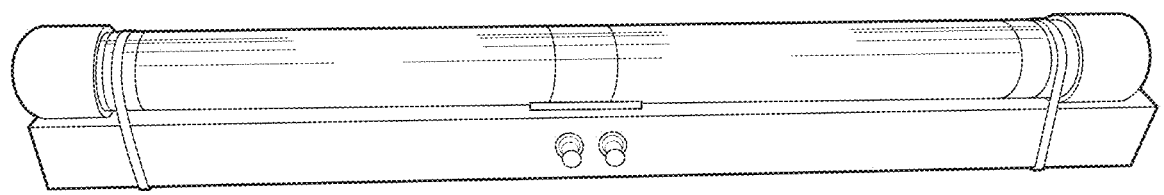
FIG. 5 shows a picture of a fabricated counter-wound Normal Mode Helical Antenna.

An embodiment of a C-NMHA structure according to the present invention was fabricated and tested. The dimensions of the fabricated antenna are the same as those used in the simulations described above, but with the addition of a ferrite core with a $\mu_r \sim 125$. The ferrite core was added to increase the inductance of the fabricated structure, thus lowering the resonant frequency. The lower resonant frequency expands the QS region/range of the antenna when driven at resonance. FIG. 5 shows a picture of the fabricated C-NMHA. After fabrication of the antenna, the distance dependence, pattern, and cancellation of the magnetic field were measured and compared to theory.

Figure 6:
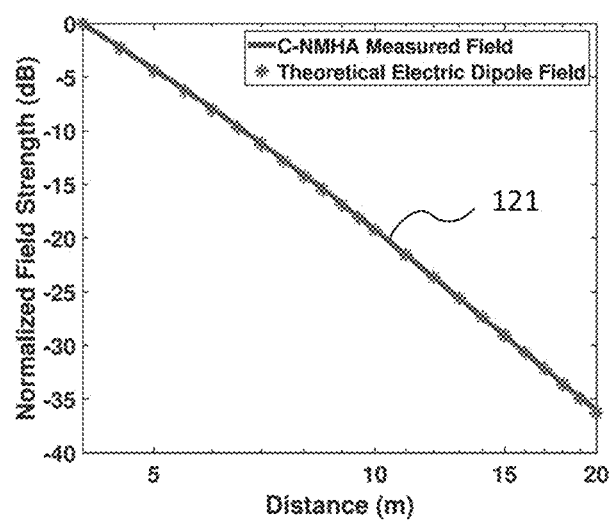
FIG. 6 shows a comparison of an electric field drop-off between theory and measurement for a counter-wound Normal Mode Helical Antenna.

The generated EQS field was measured over distance. The antenna was placed vertically with respect to the ground, and measurements were taken with an electrically short receive dipole antenna in the same orientation. The two arms of the receive structure were fed into a Stanford Research Systems SRS-560 differential amplifier, and then sampled with a National Instruments NI-6356 data acquisition unit. Measurements were taken at discrete steps away from the C-NMHA. The data was validated by comparing the measurements with that of a theoretical vertical electric dipole in the presence of an ideal ground plane. As is expected for an electric dipole oriented normal to the ground surface, the image currents produced will generate a constructive field. The comparison of the theoretical field and measured field is shown in FIG. 6. In FIG. 6, line 121 shows the measured field, and the results of the theoretical calculations are shown by the points plotted on top of line 121. As shown in FIG. 6, the measured field values match well with theory, with a 0.37 dB RMS error between the two. These measurements show the fabricated structure is generating a QS electric field with an appropriate drop-off.

To further confirm the generation of an electric moment, field coupling measurements with respect to rotation were taken with the fabricated C-NMHA structure. Two parallel plates were used to act as an electric field measurement system. The electric field generated by two parallel plates at the center should be that of a linear electric field. Based on reciprocity, this system should also be able to receive linear electric fields, enabling the detection of the field coupling between the plates and the C-NMHA. Two aluminum plates of dimensions 1.2 m×1.2 m×0.8 mm were oriented perpendicular to the ground, raised 50 cm, and spaced 1 meter apart. The two plates were connected to the inputs of an SRS-560 differential amplifier. The C-NMHA was oriented parallel to the ground and rotated in 15^° increments about the axis normal to the ground. As the C-NMHA was rotated, the potential difference of the plates was sampled on an NI-6365 to detect the field coupling strength at a given orientation.

Figure 7:
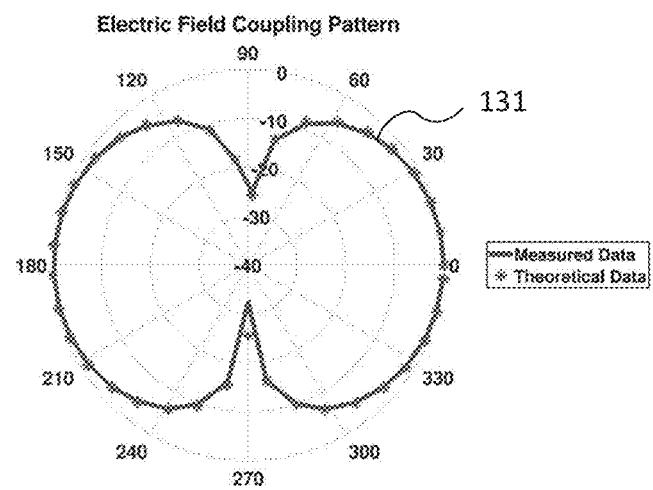
FIG. 7 shows measured field coupling data for a counter-wound Normal Mode Helical Antenna.

FIG. 7 shows the measured field coupling data compared to theoretical data. Line 131 shows the measured data, while points plotted on top of line 131 show the theoretical data at those angles. The pattern showed the expected results of an electric moment rotated about its center. The pattern measured showed good agreement with the expected cosine pattern of the field coupling equation shown in Eq. 1.

Figure 8:
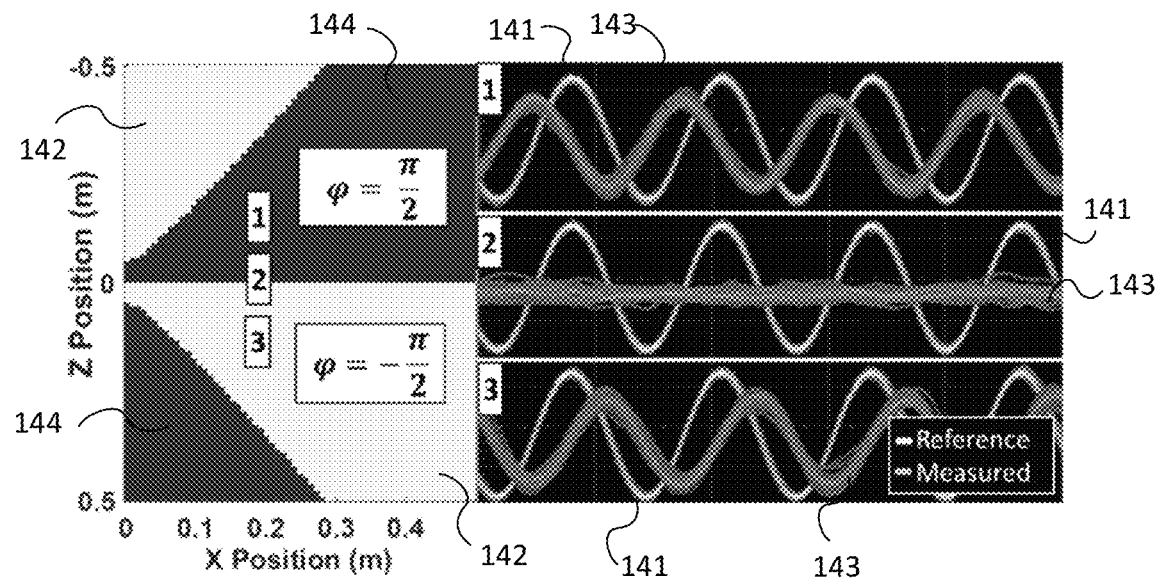
FIG. 8 shows a comparison of phase between theory and measurements for the magnetic field along the z axis for a counter-wound Normal Mode Helical Antenna.

To measure the cancellation of the magnetic field, a loop antenna with its moment oriented in the same direction as the C-NMHA was used to traverse the length of the antenna to measure the magnetic field generated by the structure. As discussed above, a cancellation should occur at the center of the structure, while the z-component fields on either side of the θ=90° plane should have equal magnitude and opposite phase. The loop antenna signal was fed into an amplifier and then measured with an oscilloscope to detect both the magnitude and phase of the field. FIG. 8 shows the measured magnetic field in the time-domain at three discrete positions 20 cm away from the structure and at a z position of +10 cm, 0 cm, and −10 cm with respect to the center of the antenna. These positions are denoted by oscilloscope measurements 1, 2, and 3.

The theoretical phase of the generated magnetic field is shown on the left of the FIG. 8. The antenna is oriented about the z-axis. The light-shaded region 142 and dark-shaded region 144 on the left side of FIG. 8 represent a π difference in phase. The lighter-shaded waveform 141 and darker-shaded waveform 143 to the right of the figure represent a reference and measured voltage of the loop antenna in presence of the magnetic field, respectively. Waveforms 1 and 3 were measured in the two regions defined in the theory plot, whereas waveform 2 was measured at the center of the antenna. As is shown in both theory and measurement, a cancellation of the magnetic field is seen at the center of the antenna, while equal magnitude and π shifted phase signals are measured on opposing sides. This measurement is in alignment with the expected cancellation of the magnetic field.

Figure 9:
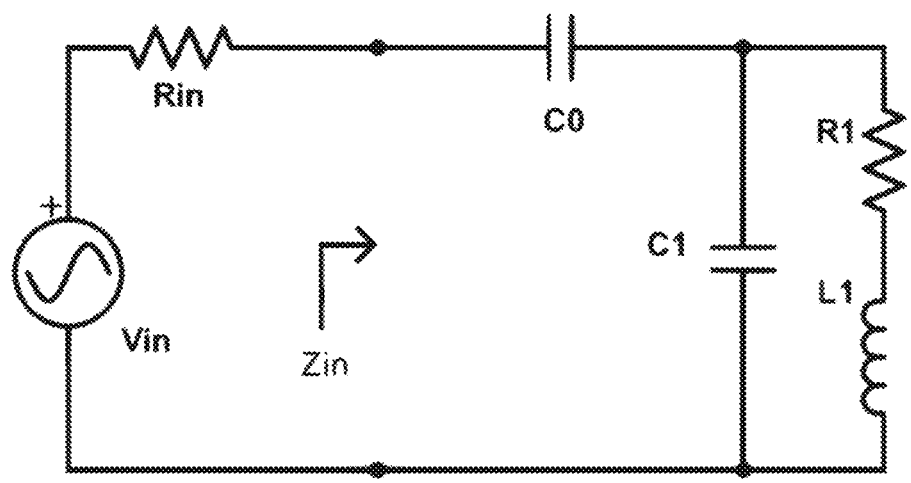
FIG. 9 shows a schematic diagram of an equivalent circuit model for a counter-wound Normal Mode Helical Antenna.

Circuit models of basic helical antennas, low-frequency response of an NMHA, and models that account for the resonances of a NMHA are known. The basic model of helical antenna also applies for a C-NMHA. Loading the C-NMHA with a magnetic core changes the values of each components in the circuit model. A schematic diagram for the C-NMHA cicuit circuit model is shown in FIG. 9. The equivalent impedance $Z_{in}$ is, for $s=j\omega$, is shown in Eq. 10 below:

$$Z_{in} = \frac{1}{sC_0} + \left[\frac{1}{sC_1} \| (R_1 + sL_1)\right]$$

$$Z_{in} = \frac{1}{sC_0} + \frac{sL_1 + R_1}{s^2 L_1 C_1 + sR_1 C_1 + 1}$$

Eq. 10

Additional C-NMHA antennas were fabricated. The impedances of the fabricated C-NMHA antenna was measured differentially using a two-port Vector Network Analyzer. An L-C tank with a capacitive impedance at both lower and upper frequency regions was observed. The series capacitor ($C_0$) is used for the lower frequency portion, and the capacitor ($C_1$) in parallel with the inductor ($L_1$) and resistor ($R_1$) in series to model the higher frequency content. The physical interpretation of each components is as follows: $L_1$ is due to the coil, $R_1$ due to the ohmic losses and radiation resistance, $C_1$ due to the capacitance between and across windings of the coil, and $C_0$ due to the potential across the antenna arms.

Impedances of three C-NMHA were measured, with and without magnetic core loading. Eq. 10 was fitted to each data and the lumped element values were solved using a nonlinear least-square optimization. The values found are shown in the table shown in FIG. 10. Variances in the element values are due to expected variances in the fabrication of exemplary embodiments of the C-NMHA according to the present invention.

Figures 10, 11:
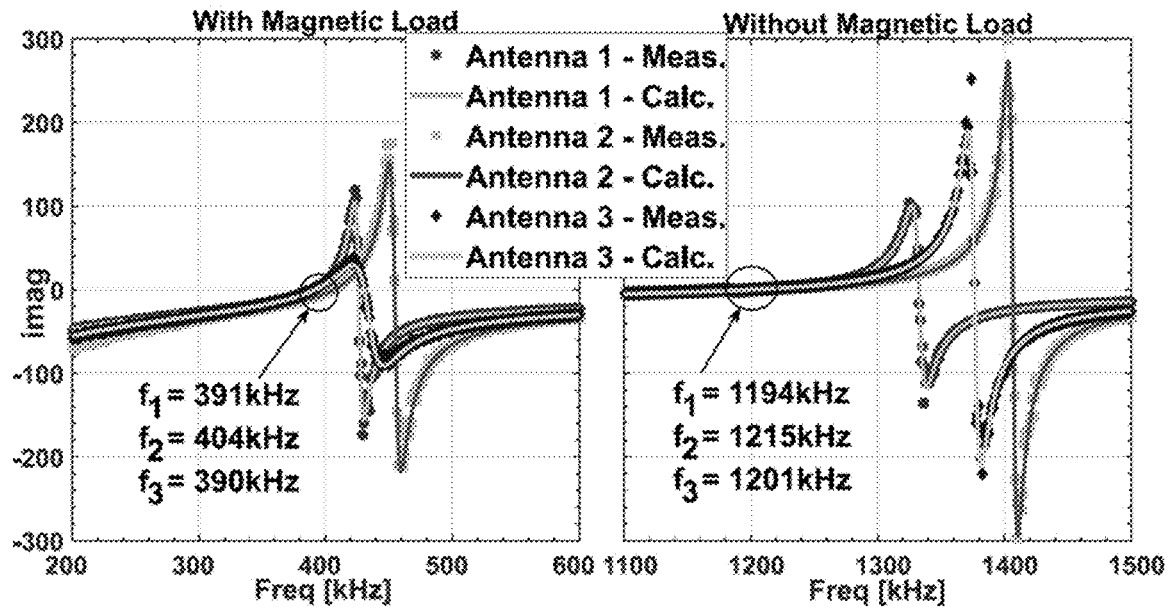
FIG. 10 shows a table of calculated equivalent circuit model component values for three fabricated counter-wound Normal Mode Helical Antennas.
FIG. 11 shows reactance of the three fabricated counter-wound Normal Mode Helical Antennas compared to the fitted circuit model with and without magnetic loading.

FIG. 11 shows the reactances of the three fabricated C-NMHA compared to the fitted circuit model with and without magnetic loading of the core. FIG. 11 shows that the optimized values of the four circuit elements fit the measured data. This data shows that the circuit model shown in FIG. 9 is a valid model for the C-NMHA. Loading the C-NMHA with a magnetic core was also shown to reduces the resonance frequency, as was expected due to the increase of the inductance of the structures. The change in inductance is shown in Table shown in FIG. 10. The table also shows the values of $C_1$ and $R_1$ increasing as they reflect the effects of the inductance. $C_0$ remains relatively unaffected due to its linkage to the electric field generated, which is not affected by the presence of a ferrite core.

Selecting the frequency of operation of the structure is defined by the circuit model shown in FIG. 9 and discussed in the previous paragraphs. The circuit model is broken down into capacitances ($C_0$ and $C_1$) and inductances ($L_1$). $C_0$ defines the parasitic capacitance of the structure due to the close proximity of windings, where $C_1$ defines the capacitance between the differentially fed arms of the structure. $L_1$ defines the helical winding. The resonant frequency is defined where $C_1$ and $L_1$ have equal and opposite reactance. The inductance of the structure is governed by the length of the structure, the diameter of the windings, the number of windings, and the permeability and permittivity of the loading core, as defined by the inductance of a helical coil. The capacitance of the structure is a function of the length of the structure. An optimization of Eq. 10 is needed at the desired resonant frequency to remove any reactive component, and thus have the structure be in resonance.

For the general case of a plurality of inductive elements, $L_1$ would be defined by the total inductance of the structure, and $C_1$ would be defined as the relative capacitance between the two feed points of the structure.

As briefly discussed above, embodiments of the C-NMHA according to the present invention described above may be used as an exciter or a detector as the antenna is passive and thus can be used in transmit or receive. Coupling the feed points of the C-NMHA to a radio-frequency generator generating a differential RF signal allows the C-NMHA to act as an EQS exciter. Coupling the feed point of the C-NMHA to a radio-frequency receiver capable of receiving a differential RF signal allows the C-NMHA to act as an ECS detector. Controlling the dimensions of the antenna, such as its length and core size, and controlling parameters related to the windings, such as the number of windings and space and size of windings, allows the C-NMHA to be adapted for various frequencies of operations. Also, as discussed above, the use of magnetic material in the C-NMHA core also allows for the frequency of operation to be lowered into a frequency area of interest, further reducing the electrical-size of the antenna.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A method for electroquasistatic excitation comprising:
generating electrical energy from a radio-frequency generator;
electrically coupling the electrical energy to a plurality of inductive elements, whereby the plurality of inductive elements generate a radiated magnetic field and a radiated electric field, the plurality of inductive elements comprising a first helix of conductive elements wound around a first arm of an antenna and a second helix of conductive elements wound around a second arm of the antenna, the first arm being opposite the second arm, the first helix being wound in a direction opposite a winding of the second helix; and
configuring the plurality of inductive elements to reduce the radiated magnetic field by driving the first arm differentially from the second arm by a differential center feed between the first arm and the second arm;
wherein electrically coupling the electrical energy to the plurality of inductive elements comprises:
coupling the electrical energy to a first plurality of inductive elements, whereby the first plurality of inductive elements generate a first magnetic dipole moment and a first electric dipole moment;
coupling the electrical energy to a second plurality of inductive elements, whereby the second plurality of inductive elements generate a second magnetic dipole moment and a second electric dipole moment; and
wherein configuring the plurality of inductive elements comprises:
configuring the first plurality of inductive elements and the second plurality of inductive elements to reduce a magnetic field resulting from a combination of the first magnetic dipole moment and the second magnetic dipole moment.

2. The method according to claim 1, wherein the first plurality of inductive elements comprises a first helix of conductive material; and wherein the second plurality of inductive elements comprises a second helix of conductive material; and wherein
configuring the first plurality of inductive elements and the second plurality of inductive elements comprises:
winding the conductive material of the first helix in a first direction;
winding the conductive material of the second helix in a second direction opposite the first direction; and
disposing the first helix and the second helix around a common center axis;
and wherein electrically exciting the first helix and the second helix further comprises:
coupling electrical energy having a first phase to a first end of the first helix; and
coupling electrical energy having a second phase to a first end of the second helix, wherein the second phase has a phase 180 degrees different than the first phase, and wherein the first end of the first helix and the first end of the second helix are positioned next to each other.

3. The method according to claim 2, further comprising disposing the first helix and the second helix around a common magnetic core.

4. The method according to claim 3, wherein the first helix and the second helix each comprise windings of conductive material having a winding count and a winding spacing and the common magnetic core has a diameter and wherein the method further comprises:
selecting lengths of the conductive material for a selected frequency of operation;
selecting a diameter for the common magnetic core for the selected frequency of operation;
selecting the winding count for the selected frequency of operation; and
selecting the winding spacing for the selected frequency of operation.

5. A method of electroquasistatic detection comprising:
electrically coupling electrical energy from a plurality of inductive elements to a radio frequency detector, whereby the plurality of inductive elements are configured to receive an electromagnetic field having a received magnetic field and a received electric field, the plurality of inductive elements comprise a first helix of conductive elements wound around a first arm of an antenna and a second helix of conductive elements wound around a second arm of the antenna, the first helix being wound in a direction opposite a winding of the second helix and the first arm being opposite the second arm; and
configuring the plurality of inductive elements to reduce the received magnetic field by driving the first arm differentially from the second arm by a differential center feed between the first arm and the second arm;
and generating or detecting an electric dipole moment on the radio frequency detector;
wherein electrically coupling electrical energy from the plurality of inductive elements to the radio frequency detector comprises:
coupling electrical energy from a first plurality of inductive elements, whereby the first plurality of inductive elements receive the electromagnetic field having a first magnetic moment component and a first electric moment component;
coupling electrical energy from a second plurality of inductive elements; whereby the second plurality of inductive elements receive the electromagnetic field having a second magnetic moment component and a second electric moment component; and
wherein configuring the plurality of inductive elements to reduce the received magnetic field comprises:
configuring the first plurality of inductive elements and the second plurality of inductive elements to reduce a received magnetic moment resulting from a combination of the first magnetic moment component and the second magnetic moment component.

6. The method according to claim 5, wherein the first plurality of inductive elements comprises a first helix of conductive material, wherein the conductive material of the first helix is wound in a first direction; and wherein the second plurality of inductive elements comprises a second helix of conductive material, and wherein configuring the first plurality of inductive elements and the second plurality of inductive elements to reduce the received magnetic moment comprises winding the conductive material of the second helix in a second direction opposite the first direction; and the method further comprises:

disposing the first helix and the second helix around a common center axis; and wherein coupling electrical energy from the first plurality of inductive elements comprises coupling electrical energy from a first end of the first helix to a first side of a differential input to a radio-frequency detection element; and wherein coupling electrical energy from the second plurality of inductive elements comprises coupling electrical energy from a first end of the second helix to a second side of the differential input to the radio-frequency detection element; and wherein the first end of the first helix and the first end of the second helix are positioned next to each other.

7. The method according to claim 6 further comprising magnetically loading the first helix and the second helix.

8. The method according to claim 7, wherein magnetically loading the first helix and the second helix comprises disposing the first helix and the second helix around a common magnetic core.

9. The method according to claim 8, wherein the first helix and the second helix comprise windings of conductive material having a winding count and a winding spacing, and wherein the method further comprises:
- selecting lengths for the conductive material of the first helix and the second helix for a selected frequency of operation;
- selecting a diameter for the common magnetic core for the selected frequency of operation;
- selecting the winding count for the selected frequency of operation; and
- selecting the winding spacing for the selected frequency of operation.

* * * * *